(12) United States Patent
Sugai et al.

(10) Patent No.: US 6,465,354 B1
(45) Date of Patent: Oct. 15, 2002

(54) METHOD OF IMPROVING THE PLANARIZATION OF WIRING BY CMP

(75) Inventors: Kazumi Sugai; Nobukazu Ito; Hiroaki Tachibana, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/435,612

(22) Filed: Nov. 8, 1999

(30) Foreign Application Priority Data

Nov. 10, 1998 (JP) ............................................. 10-319371

(51) Int. Cl.⁷ ........................ H01L 21/44; H01L 21/302; H01L 21/4763
(52) U.S. Cl. ..................... 438/692; 438/633; 438/637; 438/660; 438/645; 438/678; 438/687
(58) Field of Search ................................. 438/633, 687, 438/645–646, 690–693, 697, 678, 700, 637, 660–663

(56) References Cited

U.S. PATENT DOCUMENTS

| | | | |
|---|---|---|---|
| 5,914,532 A | * | 6/1999 | Akagi et al. ................. 257/677 |
| 6,090,701 A | * | 7/2000 | Hasunuma et al. ......... 438/632 |
| 6,107,186 A | * | 8/2000 | Erb ............................. 438/633 |
| 6,143,636 A | * | 11/2000 | Yang et al. .................. 438/687 |
| 6,184,143 B1 | * | 2/2001 | Ohashi et al. .............. 438/697 |
| 6,228,768 B1 | * | 5/2001 | Woo et al. .................. 438/691 |

FOREIGN PATENT DOCUMENTS

JP    2000-77527    3/2000

* cited by examiner

Primary Examiner—Ha Tran Nguyen
(74) Attorney, Agent, or Firm—Sughrue Mion, PLLC

(57) ABSTRACT

A manufacturing method of a semiconductor device which includes wiring dense part and wiring isolated part enables occurrence of 'Erosion' to be prevented, as well as it is capable of being prevented occurrence of 'micro-scratch' on surface of oxide layer. The manufacturing method sets a plurality of trench-parts on insulation layer, before forming metal plating layer consisting of copper so as to embed trench-parts. Manufacturing process implements annealing in such a way that grain-size of the metal plating layer in the wiring dense part becomes smaller than the grain-size in the wiring isolated part. The annealing, for instance, is implemented with substrate temperature of 70 to 200° C. Subsequently, the manufacturing step perfects the semiconductor device while polishing the metal plating layer to cause the surface of the substrate to be flat.

19 Claims, 4 Drawing Sheets

METHOD OF IMPROVING THE PLANARIZATION OF WIRING BY CMP

BACKGROUND OF THE INVENTION

The present invention relates to a manufacturing method of semiconductor device provided with a plurality of embedded wiring and/or through holes.

DESCRIPTION OF THE PRIOR ART

A formation method of conventional embedded wiring is explained referring to FIGS. 1A to 1D.

Firstly, as shown in FIG. 1A, silicone nitride film 2 (film thickness 100 nm) and silicone oxide film 3 (film thickness 1000 nm) are formed on silicone substrate 1 in order. Next, a plurality of holes which come to the silicone nitride film 2 are formed within the silicone oxide film 3 using dry etching.

Next, as shown in FIG. 1B, the manufacturing process deposits barrier metal layer 4 consisting of titanium 'Ti' and titanium nitride 'TiN' all over the surface thereof by sputtering method. Film-thickness thereof is 200 Å. Continuously, the manufacturing process deposits seed metal layer consisting of copper thereon by sputtering method for growing copper plating (not illustrated). Further, uninterruptedly, the manufacturing process immerses the silicone substrate 1 into copper sulfate aqueous solution with solution temperature about 25° C., to form metal plating layer 5 consisting of copper by electrolytic plating method. A power-supply for forming the plating, for instance, uses direct current power-supply, setting with current value as 0.5 A/dm$^2$. Here, layer thickness of metal plating layer 5 is set to approximately 900 nm in flat part. Status thereof is indicated in FIG. 1B.

The manufacturing process implements annealing about the substrate subjected to plating as mentioned above, in such a way as degree of 30 minutes with 300° C. Due to this annealing, grain-size grows larger and resistance value is lowered.

Subsequently, the manufacturing process polishes the metal plating layer 5 by 'CMP' (Chemical Mechanical Polishing) to make surface of the substrate flat, thus causing embedded wiring is perfected (FIGS. 1C, 1D).

However, above-described prior art involves following problems:

In manufacturing process of 'CMP' shown in FIGS. 1C, 1D, it is necessary to take a large amount of time for polishing such that the metal plating layer 5 on the silicone oxide layer 3 does not rest. Here, polishing speed in relation to the metal plating layer 5 is large in comparison with polishing speed in relation to the barrier metal layer 4 or the silicone oxide layer 3. For that reason, in the manufacturing process of 'CMP' after exposure of the barrier metal layer 4, wiring dense part in which a lot of embedded parts of the metal plating layer 5 exist is added high pressure on the barrier metal layer 4 and/or the silicone oxide layer 3 in comparison with wiring isolated part in which embedded part of the metal plating film exists not so many. For that reason, 'CMP' is progressed in excess at the wiring dense part, thus problem occurs that surface of insulation layer 3 becomes trench as shown in FIG. 1D. This phenomenon is 'Erosion'.

FIG. 2 shows the above-described phenomenon on graph. In FIG. 2, the horizontal axis represents polishing time, and the vertical axis represents distance (height) from a back surface of the substrate to a surface of the substrate. The surface of the substrate before starting of polishing is approximately flat, and grain-size of plating metal layer 5 placed at the upper part than the barrier metal layer 4 is approximately uniform in any place. For that reason, in the initial stage of start of polishing, polishing of the wiring isolated part and polishing of wiring dense part are progressed with equal speed. Next, when the whole metal plating layer is removed, before the barrier metal layer 4 is exposed (T1 in FIG. 2), after that, polishing becomes polishing of the barrier metal layer 4 and the silicone oxide layer 3, therefore, the polishing speed becomes slow suddenly. On the contrary, in the wiring dense part, since a lot of embedded parts of the metal plating layer 5 exist, polishing speed after 'T1' becomes larger than that of the wiring isolated part according to the reason described above. For that reason, 'Erosion' occurs.

As described above, when 'Erosion' occurs, flatness of substrate surface deteriorates. The deterioration of the flatness becomes more conspicuous in the case of multi-layer structure, thus it causes problem that short circuit of wiring part and so forth occur. Further, when it forms embedded wiring, section area becomes small, problem occurs that wiring resistance becomes large.

SUMMARY OF THE INVENTION

In view of the foregoing, it is an object of the present invention, in order to overcome the above-mentioned problems to provide manufacturing method of a semiconductor device including wiring dense part (dense pattern) and wiring isolated part, which manufacturing method enables occurrence of an 'Erosion' to be prevented.

It is another object of the present invention to provide manufacturing method of a semiconductor device including wiring dense part (dense pattern) and wiring isolated part, which manufacturing method enables occurrence of a microscratch to be prevented.

According to a first aspect of the present invention, in order to achieve the above mentioned object, there is provided a manufacturing method of a semiconductor device which comprises the steps of a first manufacturing step in which it forms insulation layer on a semiconductor substrate, and it forms a plurality of trench-parts at prescribed points on the insulation layer, before it forms metal plating layer on the whole surface so as to embed the plurality of trench-parts, a second manufacturing step for implementing annealing so as to cause grain-size of metal plating layer in a dense pattern where the trench-part is formed densely to be smaller than grain-size of metal plating layer in a pattern except for the dense pattern, and a third manufacturing step for causing surface of substrate to be flat while polishing the metal plating layer and the insulation layer.

In general, metal material which is subjected to plating has structure which small size grain is gathered to be formed. When the metal plating layer undergoes annealing, grain-size of the grain increases while facing in the constant direction. Thus resistance value of plating layer decreases due to the fact that the grain-size increases, with the result that characteristic as conductive film is stabilized preferably.

The conventional annealing process after plating, for instance, in the case of copper plating, the annealing has been implemented in high temperature of more than 300° C. for enhancing productivity. Under such the condition, grain is growing with uniform speed all over the surface in spite of shape of pattern for forming plating layer. Consequently, in the conventional process, there does not occur difference in grain-size between dense pattern of trench-part and another pattern except for dense-pattern. To the contrary, in the present invention, a second manufacturing step implements annealing in such a way that the grain-size of the metal plating layer in the dense pattern in which the trench-part is formed densely becomes smaller than the grain-size of the metal plating layer in the pattern except for the dense pattern.

According to an investigation of the present invention, when it causes the grain-size of metal plating layer to be small, it is capable of suppressing speed of polishing by 'CMP' and so forth effectively. For that reason, polishing of the plating layer in the dense pattern is suppressed by implementing annealing according to the above-described method, thus occurrence of 'Erosion' can be prevented.

According to a second aspect of the present invention, there is provided a manufacturing method of semiconductor device which comprises the steps of a first manufacturing step in which it forms insulation layer on a semiconductor substrate, and it forms a plurality of trench-parts at prescribed points on the insulation layer, before it forms metal plating layer on the whole surface so as to embed the plurality of trench-parts, a second manufacturing step for implementing annealing in such a condition that the step causes temperature of substrate to be about 70° C. to about 200° C., and a third manufacturing step for causing surface of substrate to be flat while polishing the metal plating layer and the insulation layer.

In the present invention, the second manufacturing step implements annealing with temperature of 70 to 200° C. Formerly, annealing of the metal plating layer is implemented in short time of degree of 30 minutes with high temperature of more than 300° C. for enhancing productivity. In the present invention, lower temperature than 300° C. is dared to be selected. According to the selection, it is capable of obtaining effect which is not known formerly that it enables the grain-size of the metal plating layer formed on dense pattern to be small selectively. Namely, the method of the present invention enables the grain in pattern isolated part to grow while suppressing grain-growth of the metal plating layer in the dense pattern. FIG. 5 shows schematic status in which the grain of the metal plating layer in the dense pattern is formed selectively in small size. It is not clear the reason why such phenomenon occurs. However, when annealing is implemented in such the low temperature range described above, it is conjectured that the grain is easy to undergo influence of shape factor of plating growth surface. Namely, in the wiring dense part (dense pattern) in FIG. 5, it is conjectured that large grain-size is not obtained, because since a plurality of trench-parts are formed, grain grows from various kinds of direction. The inventors have discovered that when annealing is implemented under the condition that substrate-temperature is set to less than 200° C., the above-described phenomenon occurs peculiarly, thus the present invention have been perfected.

In the present invention, at the time of annealing, substrate-temperature is set to less than 200° C., more preferably less than 150° C. According to such the setting of temperature, it enables the grain-size of the metal plating layer in the dense pattern to be small selectively. Further, at the time of annealing, substrate-temperature is set to more than 70° C., more preferably more than 80° C. According to such the setting of temperature, it is capable of suppressing increase of annealing time. When the substrate-temperature at the time of annealing is set to 70 to 200° C., annealing time is set to 30 to 120 minutes.

For instance, in the case of copper plating, when the substrate-temperature is set to 70 to 200° C., in the dense pattern, small grain of degree of average particle diameter 20 to 200 nm grow. On the other hand, in the area in which embedded wiring of isolated copper plating layer or isolated connection hole is provided, or in the area there does not exist copper plating layer, great grain of degree of average particle diameter of 500 to 10000 nm grow.

According to a third aspect of the present invention, there is provided a manufacturing method of a semiconductor device which comprises the steps of a first manufacturing step in which it forms insulation layer on a semiconductor substrate, and it forms a plurality of trench-parts at prescribed points on the insulation layer, before it forms metal plating layer on the whole surface so as to embed the plurality of trench-parts, a second manufacturing step for implementing annealing under the condition that 'Vickers hardness' of the metal plating layer is about 120 Hv to about 180 Hv in a dense pattern where the trench-part is formed densely, while 'Vickers hardness' of the metal plating layer is about 60 Hv to about 110 Hv in a pattern except for the dense pattern, and a third manufacturing step for causing surface of substrate to be flat while polishing the metal plating layer and the insulation layer.

The 'Vickers hardness' is one kind of definition of hardness. The 'Vickers hardness' is measured using 'Vickers hardness' tester. The 'Vickers hardness' tester squeezes quadrangular pyramid diamond with vertical angle of 136 degrees in surface of test piece while adding external force. It measures area of depression after removing external force, thus obtaining hardness number depend on average pressure in every unit area of the depression. In the second manufacturing step of the third aspect of the present invention, annealing is implemented in such a way that 'Vickers hardness' becomes 120 to 180 Hv in the dense pattern where trench-part is formed densely, while 'Vickers hardness' becomes 60 to 110 Hv in the area except for the dense pattern. Namely, annealing is implemented in such a way that hardness of the metal plating layer in the dense pattern becomes higher than the hardness of the metal plating layer in the area except for the dense pattern. According to such annealing, it is capable of suppressing polishing of the dense pattern, thus it is capable of suppressing occurrence of 'Erosion'.

Above-described range of 'Vickers hardness' can be realized by implementing annealing, for instance, with the substrate-temperature as 70 to 200° C. In the case of copper plating, when the substrate-temperature is set to 70 to 200° C. at the time of annealing, degree of average particle diameter 20 to 200 nm of small grain grow in the dense pattern, while in the area in which copper wiring and so forth are provided in isolated condition, or in the area in which there does not exist wiring pattern, degree of average particle diameter of 500 to 10000 nm of large grain grow. The 'Vickers hardness' of plating layer consisting of the above-described small grain becomes 120 to 180 Hv, while the 'Vickers hardness' of plating layer consisting of the above-described large grain becomes 60 to 110 Hv.

In the present invention, it is preferable that the 'Vickers hardness' in the dense pattern is set to 130 to 180 Hv, while the 'Vickers hardness' in the area except for the dense pattern is set to 60 to 100 Hv. According to such the setting, it is capable of further suppressing occurrence of the 'Erosion'.

According to a fourth aspect of the present invention, in any of the first to the third aspects, there is provided a manufacturing method of a semiconductor device, wherein the metal plating layer is copper system metal layer.

According to a fifth aspect of the present invention, in any of the first to the fourth aspects, there is provided a manufacturing method of a semiconductor device, wherein formation of the metal plating layer in the first manufacturing step is implemented according to an electrolytic plating method in which a pulse power source is employed, and whose current value is in a range of about 2 to about 5 $A/dm^2$.

According to a sixth aspect of the present invention, in any of the first to the fifth aspects, there is provided a manufacturing method of a semiconductor device, wherein a third manufacturing step for causing surface of substrate to be flat while polishing the metal plating layer and the insulation layer is implemented using 'CMP' (Chemical Mechanical Polishing).

According to seventh aspect of the present invention, in any of the first to the sixth aspects, there is provided a manufacturing method of a semiconductor device, wherein 'applied pressure' is set to about 1 to about 10 psi at the time when said 'CMP' (Chemical Mechanical Polishing) is implemented.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DETAILED DESCRIPTION OF THE PREFERRED EMBODIMENT

A preferred embodiment of the present invention will be described in detail in accordance with the accompanying drawings.

In the present invention, 'trench-part' means a hole or a groove for forming embedded wiring and/or plug.

In the present invention, 'dense pattern' is defined as a pattern in which a plurality of 'trench-parts' are placed with interval of about from one to three times of width of the 'trench-part', in particular, 'dense pattern' is a pattern in which the 'trench-parts' more than three are placed with degree of the same interval as the width of the 'trench-part'. Metal plating film such as copper and so forth is embedded into the 'trench-part', the embedded wiring and/or plug are formed. Width of the 'trench-part' is, for instance, degree of 0.1 to 1 μm, in particular, when width of 'trench-part' is width of 0.1 to 0.5 μm, effect of the present invention becomes more remarkable.

In the present invention, it forms also seed metal layer after the first manufacturing process. Due to this formation, it is capable of being formed metal plating layer appropriately. It is desirable that material of seed metal layer or metal plating layer consists of copper, silver or an alloy thereof, in particular, copper system metal consisting of copper or copper alloy are suitable. These metal materials have low resistance, and there is a few problems of electro-migration and so forth. Further, the seed metal layer is capable of being formed by sputtering method.

As insulation film in the present invention, low dielectric constant materials such as 'SOG' film and so forth except for silicone oxide film or silicone nitride film which are used previously are capable of being used. Here, kinds of the 'SOG' film are not restricted particularly. It is capable of being used inorganic 'SOG' film, organic 'SOG' film, or 'HSQ' (Hydrogen Silisesquioxane) film and so forth.

The 'SOG' film, in particular, 'HSQ' film, and organic 'SOG' film have excellent balance of property such as dielectric constant, gas emission property and so forth, thus these are capable of being used as layer insulation film preferably. However, since these materials spend large polishing speed caused by 'CMP', there is a problem that 'Erosion' and/or 'micro-scratch' are easy to occur. According to the present invention, it is capable of utilizing excellent property of the above-described materials while avoiding problem of 'Erosion'.

Figure 1A:
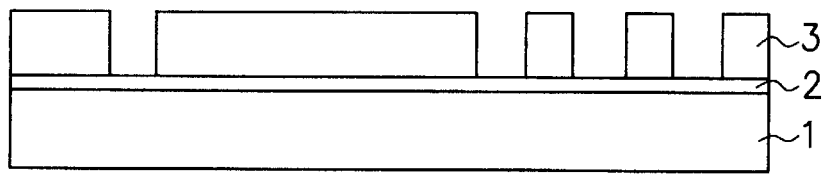
FIGS. 1A to 1D are manufacturing process sectional views showing conventional manufacturing method of a semiconductor device.
Figure 1B:
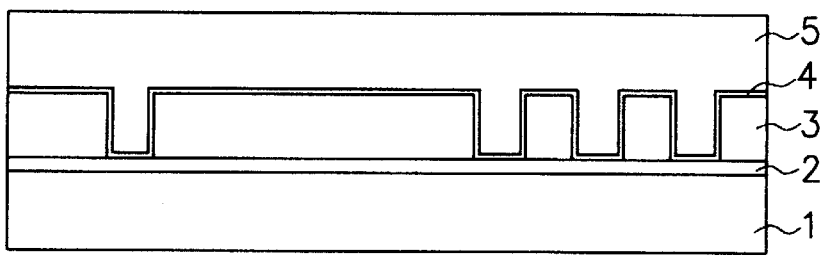
Figure 1C:
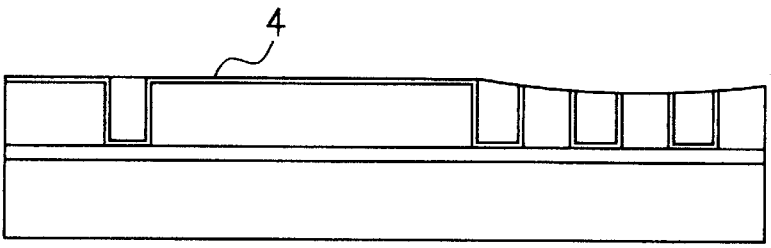
Figure 1D:
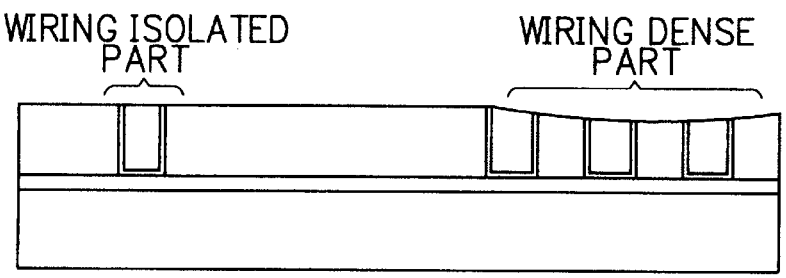
Figure 2:
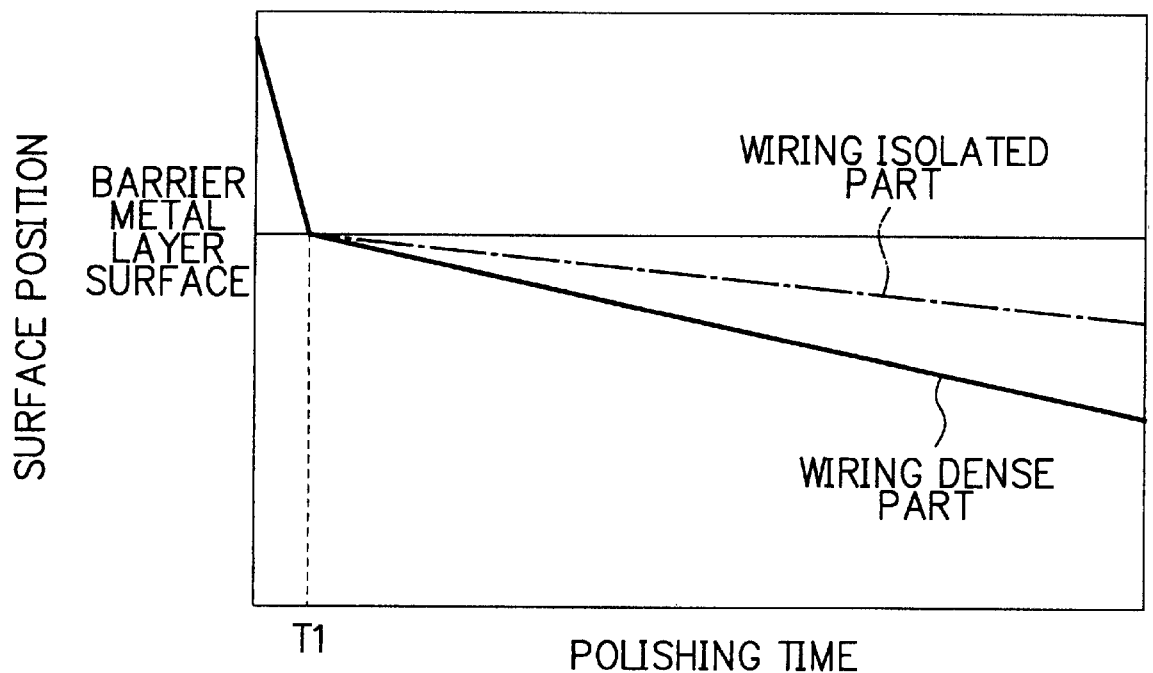
FIG. 2 is a vies showing relationship between 'CMP' polishing time and polishing quantity in the conventional manufacturing method of semiconductor device.
Figure 3:
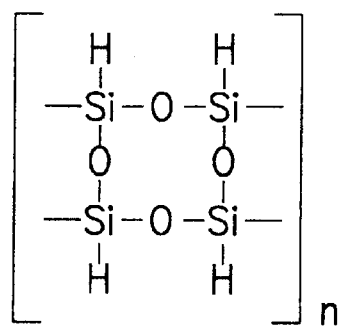
FIG. 3 is a view showing structural formula of 'HSQ'.

Relative dielectric constant of the 'HSQ' film is from 2.8 to 3.1. The 'HSQ' film has structure shown in FIG. 3. In FIG. 3, 'n' is integer.

On the other hand, the organic 'SOG' film has a structure in which methyl group and so forth are combined to silicone oxide. Concerning the relative dielectric constant of the organic 'SOG' film, the higher organic component content ratio is, the less relative dielectric constant decrease, thus it is also capable of obtaining the relative dielectric constant which is degree of 2.1 to 2.7.

The manufacturing process coats the 'SOG' layer on the substrate, before implementing heat treatment. The heat treatment to the 'SOG' layer is implemented normally under an inert gas atmosphere. However, when 'HSQ' film is employed as 'SOG' film, it is also suitable to implement the heat treatment under atmosphere in which oxygen and water are removed. It is preferable to set temperature of the heat treatment to 350 to 500° C. When temperature of the heat treatment exceeds 500° C., chemical bond between 'Si' and 'H' is cut, thus the dielectric constant of the 'SOG' film may increase. When temperature of the heat treatment is less than 350° C., crack may occur on the insulating layer formed on the 'SOG' layer.

In the present invention, it forms the metal plating layer so as to embed trench-part on the whole surface thereof, on this occasion, it is suitable to set barrier metal layer at interface between insulating layer and the metal plating layer. As the barrier metal film, 'Ta', 'TiN' and so forth are employed preferably, and these are capable of being formed by the method of 'PVD', 'CVD' and so forth.

In the present invention, formation of the metal plating layer in the first manufacturing process is preferably implemented in such a way that it increases current value in high speed. Concretely, formation of the metal plating layer is preferably implemented by an electrolytic plating method in which a pulse power-supply is used, and the current value thereof is in a range of about 2 to about 5 A/dm². It is capable of diminishing grain-size of the metal plating layer in the stage before annealing by forming the metal plating layer under such condition. Due to this matter, it is possible to make differences of the grain-size after annealing between dense pattern and another pattern are more noticeable, thus it is possible to prevent the occurrence of 'Erosion' and/or 'micro scratch' more effectively.

In the third manufacturing process of the present invention, surface of the substrate is set in flatness. It is preferably implemented by 'CMP' that it causes the surface of the substrate to be flat. According to this manufacturing process, it causes the surface of the substrate on which embedded wiring and/or plug are formed to be flat preferably. Added pressure during implementing 'CMP' is preferably 1 to 10 psi, further, more preferably 2 to 6 psi.

EMBODIMENT 1

There will be described the present embodiment referring to FIGS. 4A to 4D.

Figure 4A:
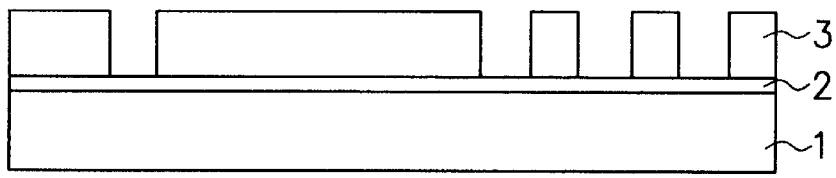
FIGS. 4A to 4D are manufacturing process sectional views showing manufacturing method of semiconductor device of the present invention.

As shown in FIG. 4A, the manufacturing process forms silicone nitride layer 2 with layer thickness of 100 nm, and silicone oxide layer 3 with layer thickness of 1000 nm in this order. Subsequently, a plurality of holes which come to the silicone nitride layer 2 are formed by dry-etching at prescribed places. As shown in FIG. 4A, there are provided wiring dense part (dense pattern) and wiring isolated part.

Figure 4B:
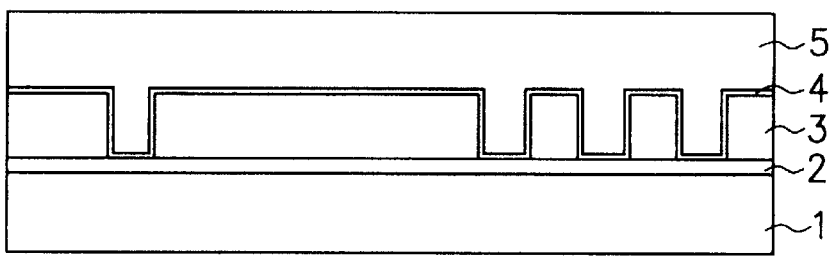

Next, as shown in FIG. 4B, barrier metal layer 4 consisting of 'Ti' and/or 'TiN' have been deposited on the whole surface of silicone substrate by the sputtering method. The layer thickness is 200 Å. The seed metal layer consisting of copper for growing copper plating have been deposited thereon by the sputtering method (not illustrated). Uninterruptedly, the method immerses the silicone substrate 1 into copper sulfate aqueous solution with solution temperature about 25° C., to form metal plating layer 5 consisting of copper by electrolytic plating method. On this occasion, current is pulse current such as duty ratio is 5:1, 3 A/dm². Due to the current value, it is capable of being formed the metal plating layer 5 with small grain-size. Here, layer thickness of the metal plating layer 5 is set to degree of 900 nm in flat part. This status is shown in FIG. 4B.

Figure 5:
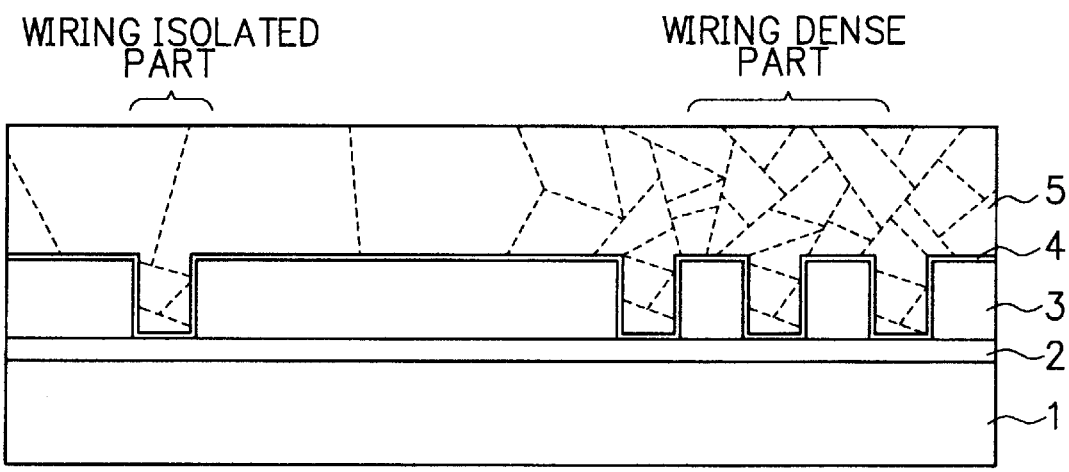
FIG. 5 is a view showing a status after annealing in the manufacturing method of the semiconductor device of the present invention.

The manufacturing process implements annealing at degree of 60 minutes with 100° C. about the silicone substrate on which plating is executed as above. Since annealing temperature is set to 100° C., effect is obtained that it is capable of being set selectively grain size of the metal plating layer 5 formed in dense pattern. FIG. 5 shows the effect schematically. In FIG. 5, surrounded part by dotted line is grain of copper.

The 'CMP' is executed after annealing. On the occasion of the 'CMP', solution which aluminium oxide particle added to solution including hydrogen peroxide solution, and iron nitrate has been used as abrasive solution. Abrasive pressure has been set to about 3 to 5 psi.

Figure 4C:
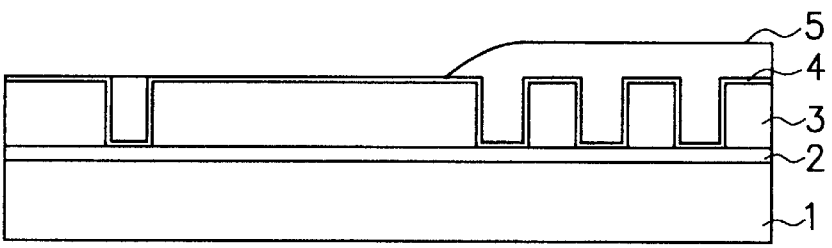
Figure 4D:
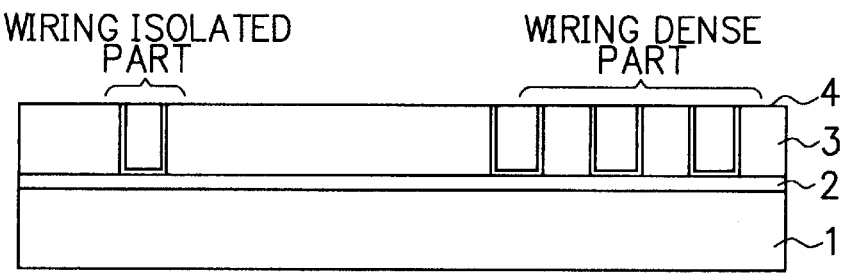

On the occasion of 'CMP', plating thickness in wiring dense part has high hardness due to small grain size, thus the 'CMP' abrasive speed is slow. For that reason, in the initial stage of 'CMP' process, polishing is progressed in the wiring isolated part, thus barrier metal layer 4 and/or silicone oxide layer 3 are exposed. On the other hand, the metal plating layer 5 remains in the wiring dense part (FIG. 4C). When the 'CMP' is further continued from this condition, polishing of the metal plating layer 5 of the wiring dense part progresses preferentially, thus causing the surface of the substrate to be flat (FIG. 4D). The metal plating layer 5 of the wiring dense part is hard to be polished in comparison with the metal plating layer 5 of the wiring isolated part. However, polishing speed of the metal plating part in the wiring dense part is particularly large in comparison with the case of barrier metal layer 4, and silicone oxide layer 3.

Figure 6:
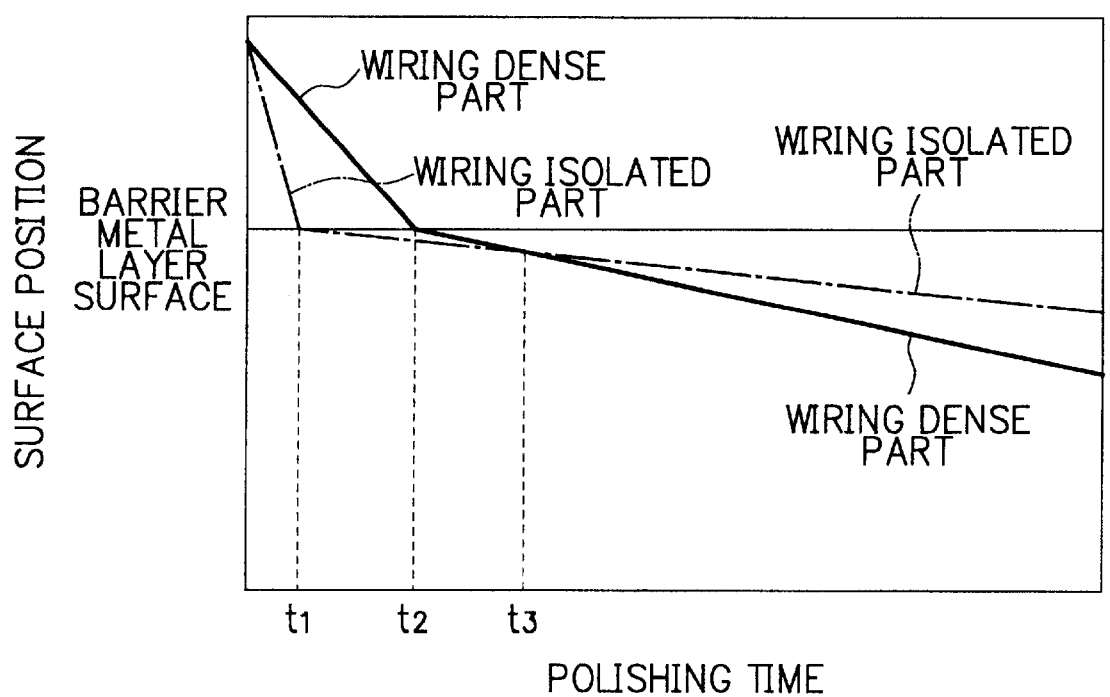
FIG. 6 is a view showing relationship between 'CMP' polishing time and polishing quantity in the manufacturing method of the semiconductor device of the present invention.

FIG. 6 shows above described phenomena (FIGS. 4B to 4D) using graph. In FIG. 6, the horizontal axis represents polishing time, and the vertical axis represents distance (height) from back surface of the substrate to surface of the substrate. The surface of the substrate before starting of polishing is approximately flat. When the polishing is started, at first, polishing of the wiring isolated part progresses more quickly than that of the wiring dense part. However, in the wiring isolated part, when the barrier metal layer 4 is exposed after the whole metal plating layer is removed (t1 in FIG. 6), thereafter, since polishing becomes polishing of the barrier metal layer 4, or the silicon oxide layer 3, polishing speed of this pattern becomes suddenly slow. Consequently, during period from $t_1$ to $t_2$, polishing of the wiring dense part progresses more quickly. Subsequently, when the 'CMP' time comes to $t_2$, the whole metal plating layer is removed in the wiring dense part, thus the barrier metal layer 4 is exposed. Thereafter, polishing becomes polishing of the barrier metal layer 4, or the silicone oxide layer 3, therefore, the polishing speed of this pattern becomes suddenly slow. However, in this pattern, occupied ratio of the metal plating layer 5 is high, thereby, the polishing speed after $t_2$ is larger than the wiring isolated part. In FIG. 6, both substrate surface positions in two patterns at $t_3$ are equal.

In order to terminate the 'CMP' at the $t_3$, it is preferable to adopt the method for detecting change of rotational torque of the 'CMP'. When the barrier metal layer 4 and or the silicone oxide 3 are exposed on the whole surface, the rotational torque increases. It is capable of being detected time to be terminated the 'CMP' by detecting the increase of the rotational torque.

In the present embodiment, the polishing of the wiring dense part progresses late for that of the wiring isolated part described above, therefore, it is capable of dissolving occurrence of 'Erosion' and/or 'micro-scratch' which is the conventional problem to be achieved. About the semiconductor device completed whose surface flatness has been evaluated using 'AFM' (Atomic Force Micro scope) or tracer type three-dimensional plofiler. It is ascertained that surface of the semiconductor device manufactured by the method of the present embodiment is made flat in the degree that there is no problem practically.

EMBODIMENT 2

There will be described the present embodiment 2 referring to FIGS. 4A to 4D.

As shown in FIG. 4A, the manufacturing process forms silicone nitride layer 2 with layer thickness of 100 nm, and silicone oxide layer 3 with layer thickness of 1000 nm in this order. Subsequently, a plurality of holes which come to the silicone nitride layer 2 are formed by dry-etching at prescribed places. As shown in FIG. 4A, there are provided wiring dense part (dense pattern) and wiring isolated part.

Next, as shown in FIG. 4B, barrier metal layer 4 consisting of 'Ti' and/or 'TiN' have been deposited on the whole surface of silicone substrate by the sputtering method. The layer thickness is 200 Å. The seed metal layer consisting of copper for growing copper plating have been deposited thereon by the sputtering method (not illustrated). Uninterruptedly, the method immerses the silicone substrate 1 into copper sulfate aqueous solution with solution temperature about 25° C., to form metal plating layer 5 consisting of copper by electrolytic plating method. On this occasion, current is pulse current such as duty ratio is 5:1, 3 A/dm$^2$. Due to the current value, it is capable of being formed the metal plating layer 5 with small grain-size. Here, layer thickness of the metal plating layer 5 is set to degree of 900 nm in flat part. This status is shown in FIG. 4B.

The manufacturing process implements annealing degree of 30 minutes with 200° C. about the silicone substrate on which plating is executed as above. Since annealing temperature is set to 200° C., effect is obtained that it is capable of being set selectively grain size of the metal plating layer 5 formed in dense pattern. FIG. 5 shows the effect schematically. In FIG. 5, surrounded part by dotted line is grain of copper. In the present embodiment 2, also the polishing of the wiring dense part progresses late for that of the wiring isolated part, therefore, it is capable of dissolving occurrence of 'Erosion' and/or 'micro-scratch'. About the semiconductor device completed whose surface flatness has been evaluated using tracer type three-dimensional plofiler. It is ascertained that surface of the semiconductor device manufactured by the method of the present embodiment 2 is made flat in the degree that there is also no problem practically.

COMPARISON EXAMPLE

There will be described the comparison example referring to FIGS. 4A to 4D.

As shown in FIG. 4A, the manufacturing process forms silicone nitride layer 2 with layer thickness of 100 nm, and silicone oxide layer 3 with layer thickness of 1000 nm in this order. Subsequently, a plurality of holes which come to the silicone nitride layer 2 are formed by dry-etching at prescribed places. As shown in FIG. 4A, there are provided wiring dense part (dense pattern) and wiring isolated part.

Next, as shown in FIG. 4B, barrier metal layer 4 consisting of 'Ti' and/or 'TiN' have been deposited on the whole surface of silicone substrate by the sputtering method. The layer thickness is 200 Å. The seed metal layer consisting of copper for growing copper plating have been deposited thereon by the sputtering method (not illustrated). Uninterruptedly, the method immerses the silicone substrate 1 into copper sulfate aqueous solution with solution temperature about 25° C., to form metal plating layer 5 consisting of copper by electrolytic plating method. On this occasion, current is pulse current such as duty ratio is 5:1, 3 A/dm$^2$. Due to the current value, it is capable of being formed the metal plating layer 5 with small grain-size. Here, layer thickness of the metal plating layer 5 is set to degree of 900 nm in flat part. This status is shown in FIG. 4B.

The manufacturing process implements annealing degree of 30 minutes with 300° C. about the silicone substrate on which plating is executed as above. About the semiconductor device completed whose surface flatness has been evaluated using tracer type three-dimensional plofiler. It is ascertained that the semiconductor device manufactured by the method of the comparison example in which the 'Erosion' occurs.

As described above, according to the present invention, in the manufacturing method of the semiconductor device including wiring dense part (dense pattern) and wiring isolated part, the manufacturing method causes occurrence of the 'Erosion' to be prevented and it is capable of being prevented occurrence of the 'micro-scratch' on the surface of the oxide layer.

While preferred embodiments of the invention have been described using specific terms, such description is for illustrative purpose only, and it is to be understood that changes and variations may be made without departing from the sprit or scope of the following claims.

What is claimed is:

1. A method for manufacturing a semiconductor device comprising the steps of:

forming an insulation layer on a semiconductor substrate, wherein said insulation layer comprises a first portion having a plurality of trench-parts before forming a metal plating layer on the whole surface of the insulation layer including the trench-parts so as to embed a metal in said plurality of trench-parts and wherein the formation of said metal plating layer is implemented according to an electrolytic plating method in which a pulse power source is employed, and whose current value is in a range of about 2 to about 5 A/dm$^2$, wherein said first portion comprises a dense pattern of trench-parts;

annealing so as to cause a grain-size of the metal embedded in the trench-parts and the metal plating layer of said first portion to be smaller than a grain-size of the metal plating layer not in said first portion; and polishing the metal plating layer and the insulation layer to produce a flattened surface.

2. A manufacturing method of a semiconductor device as claimed in claim 1; wherein said metal plating layer is copper system metal layer.

3. A manufacturing method of a semiconductor device as claimed in claim 2, wherein the step of polishing said metal plating layer and said insulation layer uses 'CMP' (Chemical Mechanical Polishing).

4. A manufacturing method of a semiconductor device as claimed in claim 3, wherein an 'applied pressure' is set from about 1 to about 10 psi at the time when said 'CMP' (Chemical Mechanical Polishing) is implemented.

5. A manufacturing method of a semiconductor device as claimed in claim 1, wherein the step of polishing said metal plating layer and said insulation layer uses 'CMP' (Chemical Mechanical Polishing).

6. A manufacturing method of a semiconductor device as claimed in claim 5, wherein an 'applied pressure' is set from about 1 to about 10 psi at the time when said 'CMP' (Chemical Mechanical Polishing) is implemented.

7. A method for manufacturing a semiconductor device comprising the steps of:

forming an insulation layer on a semiconductor substrate, wherein said insulation layer is provided with a plurality of trench-parts before forming a metal plating layer on the whole surface of the insulation layer including the trench-parts so as to embed a metal in said plurality of trench-parts and wherein the formation of said metal plating layer is implemented according to an electrolytic plating method in which a pulse power source is employed, and whose current value is in a range of about 2 to about 5 A/dm$^2$;

annealing under a condition wherein the substrate temperature reaches a temperature in a range of about 70° C. to about 200° C.; and polishing the metal plating layer and the insulation layer to produce a flattened surface.

8. A manufacturing method of a semiconductor device as claimed in claim 7; wherein said metal plating layer is copper system metal layer.

9. A manufacturing method of a semiconductor device as claimed in claim 8, wherein the step of polishing said metal plating layer and said insulation layer uses 'CMP' (Chemical Mechanical Polishing).

10. A manufacturing method of a semiconductor device as claimed in claim 9, wherein an 'applied pressure' is set from about 1 to about 10 psi at the time when said 'CMP' (Chemical Mechanical Polishing) is implemented.

11. A manufacturing method of a semiconductor device as claimed in claim 7, wherein the step of polishing said metal plating layer and said insulation layer uses 'CMP' (Chemical Mechanical Polishing).

12. A manufacturing method of a semiconductor device as claimed in claim 11, wherein an 'applied pressure' is set from about 1 to about 10 psi at the time when said 'CMP' (Chemical Mechanical Polishing) is implemented.

13. A method for manufacturing a semiconductor device comprising the steps of:

forming an insulation layer on a semiconductor substrate, wherein said insulation layer comprises a first portion having a plurality of trench-parts before forming a metal plating layer on the whole surface of the insulation layer including the trench-parts so as to embed a metal in said plurality of trench-parts and wherein the formation of said metal plating layer is implemented according to an electrolytic plating method in which a pulse power source is employed, and whose current value is in a range of about 2 to about 5 A/dm$^2$, wherein said first portion comprises a dense pattern of trench-parts;

annealing under the condition that a 'Vickers hardness' of said metal plating layer is about 120 Hv to about 180 Hv in said first portion, while the 'Vickers hardness' of said metal plating layer is about 60 Hv to about 110 Hv for said plating metal layer not in said first portion; and polishing the metal plating layer and the insulation layer to produce a flattened surface.

14. A manufacturing method of a semiconductor device as claimed in claim 13; wherein said metal plating layer is copper system metal layer.

15. A manufacturing method of a semiconductor device as claimed in claim 14, wherein the step of polishing said metal plating layer and said insulation layer uses 'CMP' (Chemical Mechanical Polishing).

16. A manufacturing method of a semiconductor device as claimed in claim 15, wherein an 'applied pressure' is set from about 1 to about 10 psi at the time when said 'CMP' (Chemical Mechanical Polishing) is implemented.

17. A manufacturing method of a semiconductor device as claimed in claim 13, wherein the step of polishing said metal plating layer and said insulation layer uses 'CMP' (Chemical Mechanical Polishing).

18. A manufacturing method of a semiconductor device as claimed in claim 17, wherein an 'applied pressure' is set from about 1 to about 10 psi at the time when said 'CMP' (Chemical Mechanical Polishing) is implemented.

19. A method for manufacturing a semiconductor device comprising the steps of:

forming an insulation layer on a semiconductor substrate, wherein said insulation layer is provided with a plurality of trench-parts comprising a pattern in said insulation layer, wherein said pattern comprises a first portion having a dense pattern of trench-parts, and wherein said pattern additionally comprises a second portion having trench-parts that are not a dense pattern, forming a metal plating layer on the whole surface of the insulation layer including the trench-parts so as to embed a metal in said plurality of trench-parts and wherein the formation of said metal plating layer is implemented according to an electrolytic plating method in which a pulse power source is employed, and whose current value is in a range of about 2 to about 5 A/dm$^2$;

annealing so as to cause a grain-size of the metal embedded in the trench-parts and the metal plating layer of the first portion to be smaller than a grain-size of the metal embedded in the trench-parts and the metal plating layer not in the first portion.

\* \* \* \* \*